United States Patent
Kuo et al.

(10) Patent No.: US 10,270,486 B2
(45) Date of Patent: Apr. 23, 2019

(54) ULTRA-LOW POWER RECEIVER

(71) Applicant: Taiwan Semiconductor Manufacturing Co., Ltd., Hsinchu (TW)

(72) Inventors: Feng-Wei Kuo, Zhudong Township, Hsinchu County (TW); Chewn-Pu Jou, Hsinchu (TW); Huan-Neng Chen, Taichung (TW); Lan-Chou Cho, Hsinchu (TW); Robert Bogdan Staszewski, Dublin (IE); Sandro Binsfeld Ferreira, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/900,594

(22) Filed: Feb. 20, 2018

(65) Prior Publication Data

US 2019/0007088 A1 Jan. 3, 2019

Related U.S. Application Data

(60) Provisional application No. 62/527,228, filed on Jun. 30, 2017.

(51) Int. Cl.
| | | |
|---|---|---|
| *H04B 1/00* | (2006.01) | |
| *H04W 4/80* | (2018.01) | |
| *H04B 1/44* | (2006.01) | |
| *H03F 3/19* | (2006.01) | |
| *H03H 11/04* | (2006.01) | |
| *H04L 29/08* | (2006.01) | |

(52) U.S. Cl.
CPC ............... *H04B 1/44* (2013.01); *H03F 3/19* (2013.01); *H03H 11/04* (2013.01); *H03F 2200/294* (2013.01); *H04L 67/12* (2013.01); *H04W 4/80* (2018.02)

(58) Field of Classification Search
CPC ...... H04B 1/44; H04B 1/0017; H04B 1/0042; H04B 1/0078; H04B 1/04; H04B 1/16; H04B 1/40; H03H 11/04; H03F 3/19; H03F 2200/294; H04W 4/80; H04L 67/12; H04L 27/148
See application file for complete search history.

(56) References Cited

U.S. PATENT DOCUMENTS

| | | | | |
|---|---|---|---|---|
| 8,325,865 | B1* | 12/2012 | Rofougaran | H04B 1/001 375/316 |
| 2007/0099588 | A1* | 5/2007 | Konchistky | H04B 1/26 455/190.1 |
| 2007/0291883 | A1* | 12/2007 | Welz | H03D 3/009 375/350 |
| 2011/0007907 | A1* | 1/2011 | Park | G10K 11/178 381/71.8 |

(Continued)

*Primary Examiner* — Andrew Wendell
(74) *Attorney, Agent, or Firm* — Duane Morris LLP (57) ABSTRACT

An ultra-low-power receiver includes a low-noise amplifier configured to receive an input analog signal and generate an amplified signal and a mixer electrically coupled to the low-noise amplifier. The mixer is configured to convert said amplified signal into an intermediate frequency signal. A progressively reduced intermediate frequency filter is configured to process the intermediate frequency signal from the mixer in discrete time.

20 Claims, 11 Drawing Sheets

(56) References Cited

U.S. PATENT DOCUMENTS

| | | | | |
|---|---|---|---|---|
| 2012/0098477 A1* | 4/2012 | Gao | ................... | G01R 31/343 |
| | | | | 318/798 |
| 2012/0200334 A1* | 8/2012 | Connell | ............... | H03D 7/1441 |
| | | | | 327/359 |
| 2012/0307806 A1* | 12/2012 | Agarwal | ........... | H04W 72/1242 |
| | | | | 370/336 |
| 2014/0080436 A1* | 3/2014 | Madadi | ................... | H03B 1/00 |
| | | | | 455/307 |
| 2014/0194081 A1* | 7/2014 | Tohidian | ............. | H04B 1/0007 |
| | | | | 455/258 |
| 2017/0070197 A1* | 3/2017 | Sivonen | ................. | H03F 3/265 |

* cited by examiner

ULTRA-LOW POWER RECEIVER

CROSS-REFERENCE TO RELATED APPLICATION

This application claims benefit of U.S. Provisional Patent Appl. Ser. No. 62/527,228, filed on Jun. 30, 2017, and entitled "ULTRA-LOW POWER RECEIVER," which is incorporated herein by reference in its entirety.

BACKGROUND

Ultra-low-power wireless applications utilize radiofrequency (RF) transceivers powered by small power sources (such as coin cell batteries) to perform rapid burst transmission or reception of data. The ultra-low-power RF transceiver is maintained in a low-power, or sleep state, when not performing burst transmission/reception. Ultra-low-power transceivers are used in a variety of Internet of Things (IoT) implementations, including embedded devices, smart devices, smartphones, etc.

One use for ultra-low-power transceivers includes Bluetooth® Low Energy (BLE). BLE requires a minimum data packet error rate to ensure successful data transmission between ultra-low-power devices. Current ultra-low-power transceivers are unable to provide reduced power required by IoT devices with adequate noise filtering sufficient to maintain the minimum data packet error rate of BLE.

BRIEF DESCRIPTION OF THE FIGURES

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In various embodiments, a fully discrete-time (DT), high intermediate frequency (IF) transmission architecture is disclosed. The fully DT, high IF transmission architecture includes an ultra-low-power receiver. An ultra-low-power transmitter can be coupled to the transmission architecture. The ultra-low-power discrete-time receiver includes a low-noise amplifier, at least one mixer coupled to the low-noise filter, and an intermediate frequency filter configured to process an intermediate frequency signal in discrete time. The intermediate frequency filter can include a plurality of progressively reduced intermediate frequency filters to generate a discrete time, high intermediate frequency output signal. The discrete time, high intermediate frequency output signal can be digitized by one or more analog-to-digital converters and provided to signal processing circuitry, such as a signal processor.

Figure 1:
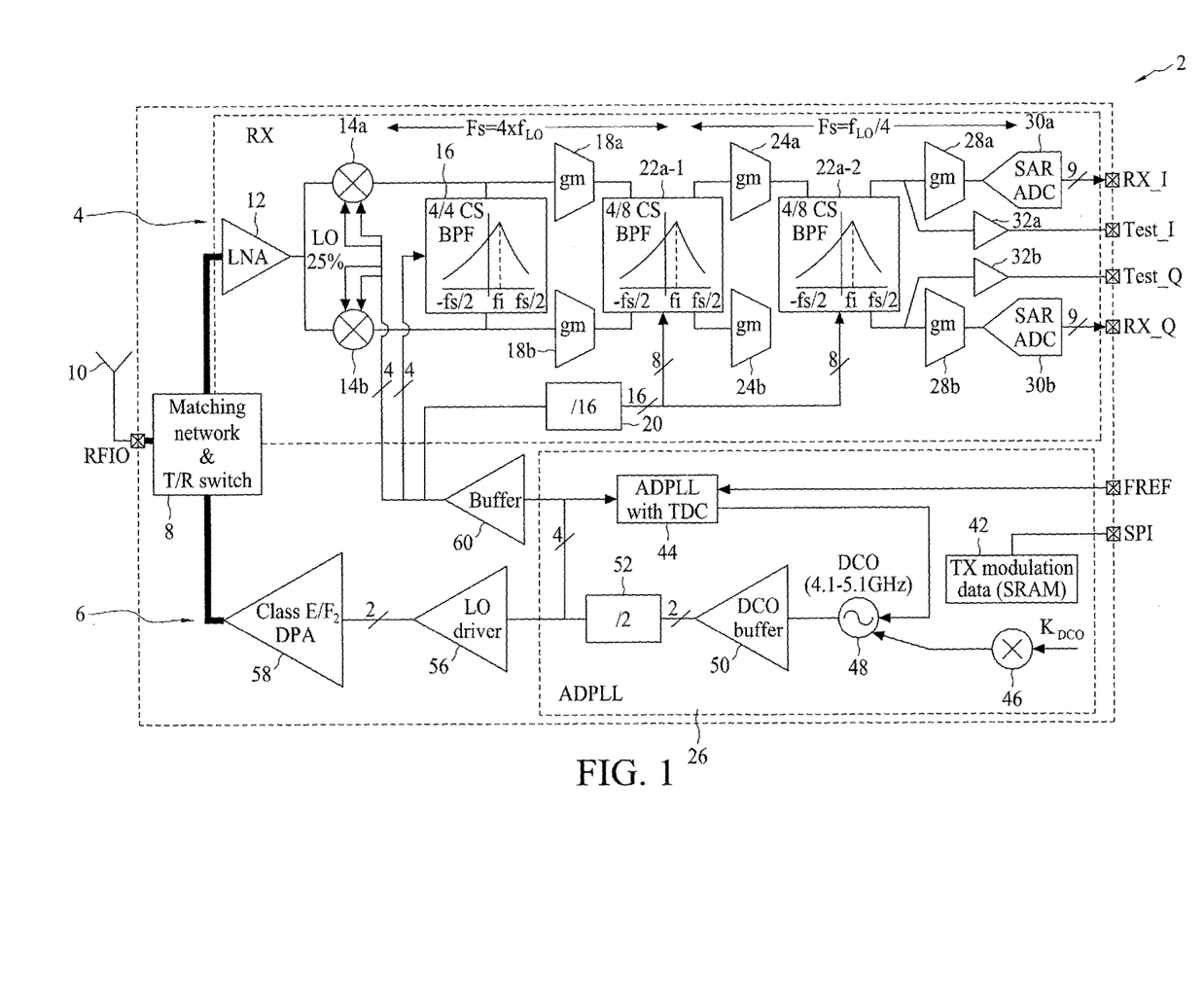
FIG. 1 illustrates an ultra-low-power transceiver including an ultra-low-power discrete-time receiver and an ultra-low-power transmitter, in accordance with some embodiments.

FIG. 1 illustrates an ultra-low-power transceiver 2, in accordance with some embodiments. The ultra-low-power transceiver 2 includes an ultra-low-power discrete-time receiver 4 and an ultra-low-power transmitter 6. Each of the ultra-low-power discrete-time receiver 4 and the ultra-low-power transmitter 6 is coupled to a matching network 8 including a transmit/receive switch configured to selectively couple one of the ultra-low-power discrete-time receiver 4 or the ultra-low-power transmitter 6 to an antenna 10. The matching network 8 matches the impedance of the antenna 10 to the impedance of a selected one of the ultra-low-power discrete-time receiver 4 or the ultra-low-power transmitter 6.

Figure 3A:
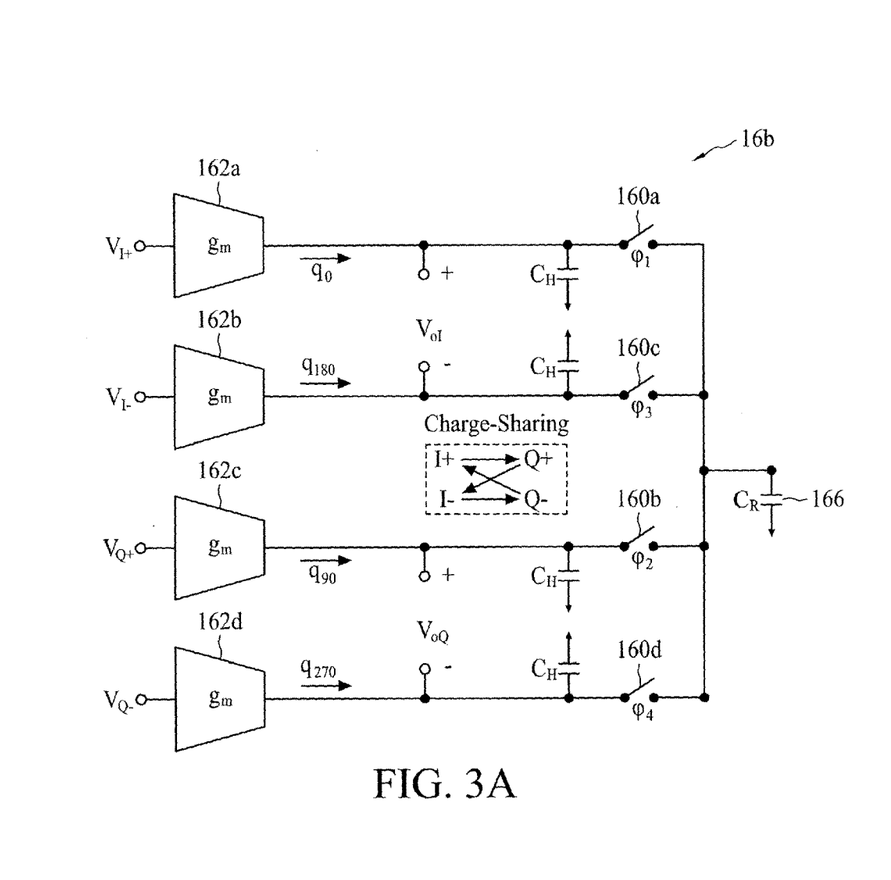
FIG. 3A illustrates a four-phase charge-sharing band-pass filter, in accordance with some embodiments.

In some embodiments, the ultra-low-power receiver 4 is configured to receive a signal from the antenna 10 and convert the signal to one or more discrete-time, high IF output signals, such as RX_I and RX_Q. The ultra-low-power receiver 4 can include a low-noise amplifier (LNA) 12 configured to receive an input signal from the matching network 8. Although embodiments are discussed herein including an LNA, it will be appreciated that the ultra-low-power receiver 4 can include any suitable amplifier, such as a low-noise amplifier, a low-noise transconductance amplifier (LNTA), an inductor-capacitor (LC) tank filter, and/or any other suitable LNA. An embodiment of the LNA 12 is discussed in more detail below with respect to FIG. 3.

In some embodiments, the amplified analog signal is provided by the LNA 12 to a plurality of mixers 14a, 14b. The mixers 14a, 14b are each configured to receive a local oscillator (LO) signal (or quadrature signal) and the amplified analog signal. The LO signal can be provided by any suitable circuit element, such as, for example, a buffer 60 in the transmission side 6 of the ultra-low-power transceiver 2, an independent local oscillator clock, and/or any other suitable circuit element. In some embodiments, each of the mixers 14a, 14b are configured to utilize a predetermined duty cycle of the LO signal. For example, in the illustrated embodiment, each of the mixers utilize a 25% duty cycle of the LO signal, although it will be appreciated that the mixers 14a, 14b can use any suitable duty cycle. Because the mixers 14a, 14b utilize a 25% duty cycle, the effective charge-sampling operation of the mixers 14a, 14b occurs at a frequency equal to $4f_{LO}$, where $f_{LO}$ is the frequency of the local oscillator signal. The mixers 14a, 14b can include any suitable mixer, such as a single-to-differential passive mixer, a quadrature mixer, or any other suitable mixer. The mixers 14a, 14b convert the received amplified analog signal into an intermediate frequency (IF) signal based on the received LO signal. In some embodiments, the LO signal and the mixer 14a, 14b are selected such that the IF signal generated by the mixers 14a, 14b is set beyond a flicker corner (i.e., 1/f noise) of one or more noise transistors in the mixers 14a, 14b.

The IF signal from the mixers 14a, 14b is provided to a plurality of progressively reduced sampling rate filters to generate discrete-time, high IF output signals. For example, in the illustrated embodiment, the IF signal is provided to a first phase IF filter 16 and a plurality of second phase IF filters 22a-1, 22a-2. The first phase IF filter 16 is configured to sample the IF signal received from the mixers 14a, 14b at a predetermined sampling rate. For example, in the illustrated embodiment, the first phase IF filter 16 is configured to sample the IF signal at a frequency of about $4f_{LO}$. The first phase IF filter 16 can include any suitable filter, such as a four-phase band-pass filter (BPF). The first phase IF filter 16 can include any suitable duty cycle, such as, for example, a 25% duty cycle. In some embodiments, the IF signal generated by the mixers 14a, 14b and provided to the progressively-reduced IF filters 16, 22a is set beyond a flicker corner (i.e., 1/f noise) of one or more noise transistors in the IF filters 16, 22a.

In some embodiments, the output of the first phase IF filter 16 is provided to one or more amplifiers 18a, 18b. The amplifiers 18a, 18b are configured to amplify the output of the first phase IF filter 16. The amplified signal is provided to a second phase IF filter 22a-1 having a second sampling rate. The second phase IF filter 22a-1 is configured to sample and filter the amplified signal received from the first phase IF filter 16 and/or the amplifiers 18a, 18b. In some embodiments, the second phase IF filter 22a-1 includes a lower sampling rate as compared to the sampling rate of the first phase IF filter 16. For example, in the illustrated embodiment, the second phase IF filter 22a-1 receives an input clock signal having a clock rate 4× slower than $f_{LO}$ (e.g., 16× slower than the sampling rate of the first phase IF filter 16), although it will be appreciated that any other suitable lower sampling rate can be used.

The output of the second phase IF filter 22a-1 is provided to a plurality of analog amplifiers 24a, 24b which amplify the output signal and provide the amplified signal to an additional second phase IF filter 22a-2. The additional second phase IF filter 22a-2 is similar to the initial second phase IF filter 22a-1. The second phase IF filter 22a-2 is configured to sample and filter the amplified signal received from the initial second phase IF filter 22a-1. Each of the second phase IF filters 22a have the same sampling rate. For example, in the illustrated embodiment, each of the second phase IF filters 22a receive an input clock signal having a clock rate 4× slower than $f_{LO}$. The second phase IF filters 22a can include any suitable IF filters, such as, for example, 8-phase BPFs.

The sequential sampling by the first phase IF filter 16 and the second phase IF filters 22a generates sufficient anti-aliasing filtering for conversion to discrete-time, high IF signals by the analog-to-digital converters (ADCs) 30a, 30b. In some embodiments, the output of second phase IF filter 22a-2 is amplified by analog amplifiers 28a, 28b prior to being provided to the ADCs 30a, 30b. The ADCs 30a, 30b can provide the discrete-time, high IF signals to one or more additional circuit elements, such as a digital signal processor.

In some embodiments, the ultra-low-power transmitter 6 is configured to receive a discrete-time signal from one or more additional circuit elements, such as a digital signal processor, and generate an analog signal for transmission by the antenna 10. The ultra-low-power transmitter 6 includes an all-digital phase lock loop (ADPLL) 26, a local oscillator driver 56, and an amplifier 58. The ADPLL 26 is configured to convert the discrete-time signal (SPI) received from the additional circuit elements into an analog signal. The analog signal is provided to the local oscillator driver 56. The local oscillator driver 56 generates an output signal that is provided to an amplifier 58. The amplifier 58 amplifies the output of the local oscillator driver 56 and provides the amplified output signal to the matching network 8 and the antenna 10. In some embodiments, the amplifier 58 includes an all-digital power amplifier.

In some embodiments, the ADPLL 26 includes a two-staggered chain topology, as shown in the illustrated embodiment. The two-staggered chain topology includes a first chain having an ADPLL 44 including a time-to-digital convertor (TDC). The ADPLL 44 is configured to generate a first input signal of a digitally-controlled oscillator (DCO) 48. The second input of the DCO 48 is generated by a second chain including a transmission modulation unit 42 and a mixer 46. The DCO 48 receives the first input from the first chain and the second input from the second chain and generates an output analog signal. The analog signal is provided to a DCO buffer 50. The analog output of the DCO buffer 50 can be provided to a divider 52. The divider can be configured for any suitable division of the analog signal, such as, for example, a division by 2, 4, 8, 16, and/or any other suitable division. The divided output can be provided to the LO driver 56.

In some embodiments, the divided output of the divider 52 can be further provided to a buffer 60. The buffer 60 can be configured to generate one or more clock signals for the ultra-low-power receiver 4, such as a clock signal provided to one or more of the IF filters 16, 22a. In other embodiments, the buffer 60 can be omitted and the clock signals of the ultra-low-power receiver 4 can be generated by a separate clock circuit (not shown).

The ultra-low power receiver 4 is robust to process, voltage, and temperature (PVT) variation. The IF filters 16,

22a include a center frequency that is defined by one or more capacitor ratios and sampling rates of the IF filters 16, 22a. The capacitor ratios are insensitive to PVT variation. In addition, the sampling rates are generated by clock division from a stable reference, such as the DCO 48 and divider 52. The capacitor ratios and sampling rates are controlled during manufacture. For example, capacitor banks of each of the IF filters 16, 22a can be digitally-programmed using binary-weighted capacitor arrays. Control of capacitor ratios and sampling rates of the filters 16, 22a during manufacturing provides precise control of the bandwidth of each of the filters 16, 22a. Control of the capacitor ratios further eliminates the need for transconductance, capacitance, and resistance calibration.

In some embodiments, the IF filters 16, 22a are passive, which provides excellent linearity and optimal power consumption. Power consumption in a passive filter structure (as described above) is due to turning on and/or off of switched-capacitor filters. By selecting an appropriate high-input impedance, the filters 16, 22a allow for the use of smaller transistors which are easier to turn on/off and therefore consume less power than traditional receivers. A high-input impedance also reduces transconductance at the amplifiers, as discussed in greater detail below.

Figure 2:
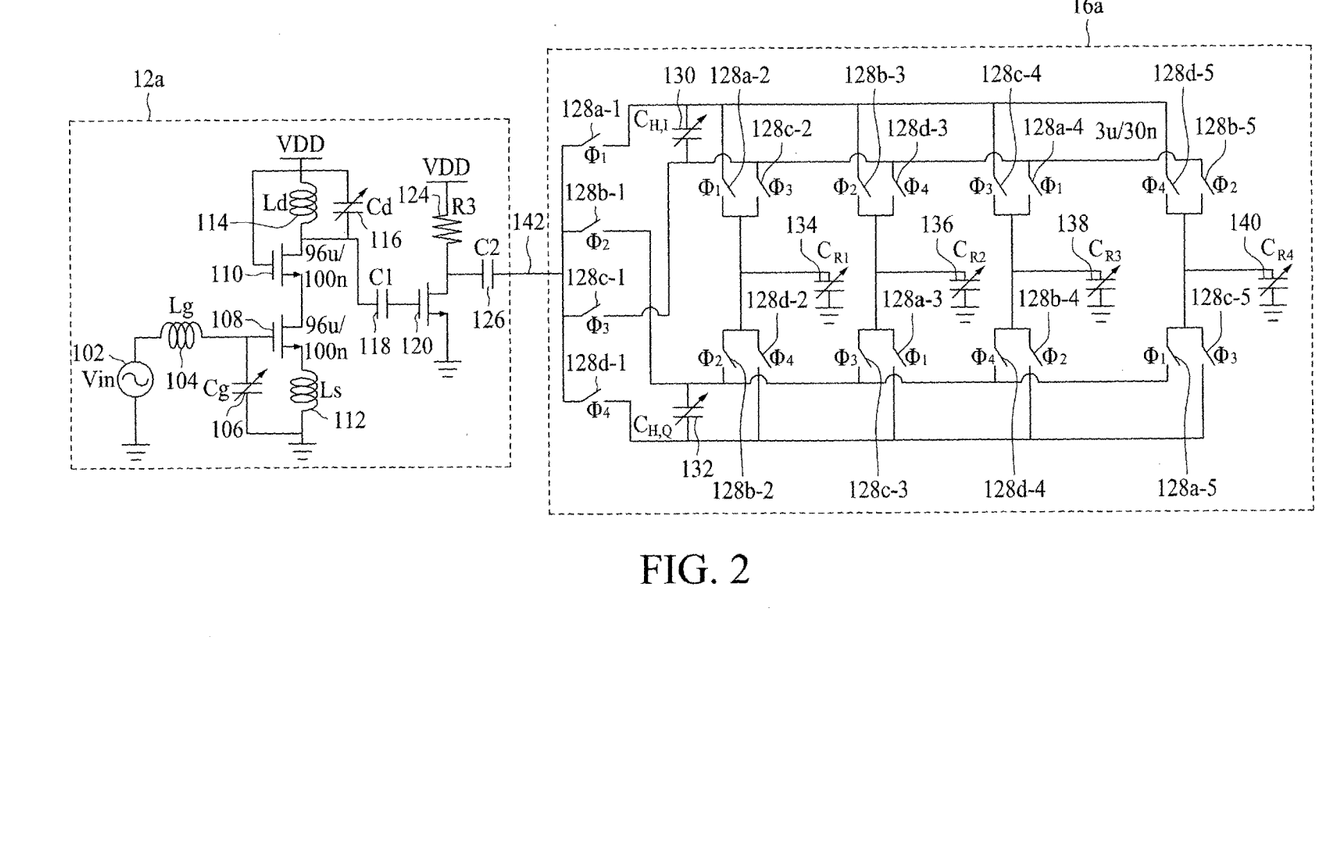
FIG. 2 illustrates a low-noise transconductance amplifier (LNTA) and four-phase charge-sharing band-pass filter of an ultra-low-power discrete time receiver, in accordance with some embodiments.

FIG. 2 illustrates a low-noise transconductance amplifier (LNTA) 12a coupled to a combination mixer and four-phase charge-sharing (CS) BPF 16a, in accordance with some embodiments. The LNTA 12a is similar to the LNA 12 discussed above, and similar description is not repeated herein. The LNTA 12a is configured to receive an analog input signal 102. The analog input signal 102 is provided to a gate of a first transistor 108. A gate inductance $L_g$ and a gate capacitance $C_g$ are represented by respective inductor 104 and capacitor 106. The first transistor 108 has a first source/drain terminal coupled to ground and including a source/drain inductance $L_s$ represented by an inductor 112. A second source/drain terminal of the first transistor 108 is coupled to a first source/drain terminal of a second transistor 110.

The second transistor 110 includes a second source/drain terminal coupled to a first capacitor 118. The second transistor 110 includes a source/drain capacitance $C_d$ and a source/drain inductance $L_d$ represented by=capacitor 116 and inductor 114, respectively. The gate of the second transistor 110 and the second source/drain terminal are coupled to an input voltage, VDD. The first capacitor 118 is coupled to a gate of a third transistor 120. The third transistor 120 has a first source/drain terminal coupled to ground and a second source/drain terminal coupled to a resistor 124 and a second capacitor 126. The resistor 124 is coupled to the supply voltage (VDD) and the second capacitor 126 is configured to provide an output signal to one or more circuit elements in an ultra-low-power receiver 4, such as one or more amplifiers 14a, 14b and/or IF filters 16.

The combined mixer and four phase BPF 16a is similar to the mixers 14a, 14b and the first phase IF filter 16 discussed above, and similar description is not repeated herein. The combined mixer and four phase BPF 16a includes a plurality of switches 128a-1 to 128a-5, 128b-1 to 128b-5, 128c-1 to 128c-5, 128d-1 to 128d-5 (collectively switches 128). Each of the switches 128 is controlled by a 25% duty cycle control signal. For example, in the illustrated embodiment, a first set of switches 128a-1-128a-4 (collectively "first switches 128a") are closed during a first 25% duty cycle of the LO signal, a second set of switches 128b-1-128b-4 (collectively "second switches 128b") are closed during a second 25% duty cycle of the LO signal, a third set of switches 128c-1-128c-4 (collectively "third switches 128c") are closed during a third 25% duty cycle of the LO signal, and a fourth set of switches 128d-1-128d-4 (collectively "fourth switches 128d") are closed during a fourth 25% duty cycle of the LO signal. Although specific embodiments are discussed herein including a 25% duty cycle, it will be appreciated that the switches 128 can be controlled using any suitable duty cycle.

In some embodiments, the four-phase BPF 16a receives an input 142 from the LNTA 12a and/or one or more amplifiers 14a, 14b. The four-phase BPF 16a samples the input signal and generates a filtered output signal. The filtered output signal can be generated by a plurality of rotating capacitors 134-140 each coupled to a subset of the switches 128 including a predetermined arrangement of the switches 128. The switches 128 in each subset of switches are controlled by corresponding control signals having duty cycles of a percentage of the LO signal and couple the capacitors 134-140 in a rotating fashion to the input 142. The rotating capacitors provide an anti-aliasing filtering (e.g., band-pass filtering) to the input analog signal. The rotating capacitors 134-140 generate a charge-sharing (CS) effect. In some embodiments, the LNTA 12a is biased by a current mirror (not shown) to compensate for PVT variation.

FIG. 3A illustrates an alternative four-phase CS BPF 16b, in accordance with some embodiments. The four-phase CS BPF 16b is similar to the first phase IF filter 16 discussed above, and similar description is not repeated herein. The four-phase CS BPF 16b receives a plurality of inputs, such as positive and negative I components (e.g., $V_{1+}$, $V_{1-}$) and positive and negative Q components (e.g, $V_{Q+}$, $V_{Q-}$). Each of the inputs is provided to an analog amplifier 162a-162d. The analog amplifiers 162a-162d are configured to amplify the input signals. The amplified I component signals have a first voltage differential ($V_{oI}$) and the amplified Q component signals have a second voltage differential ($V_{oQ}$). The four-phase CS BPF 16b includes a rotating capacitor $C_R$ and a plurality of history capacitors $C_H$.

Figure 3B:
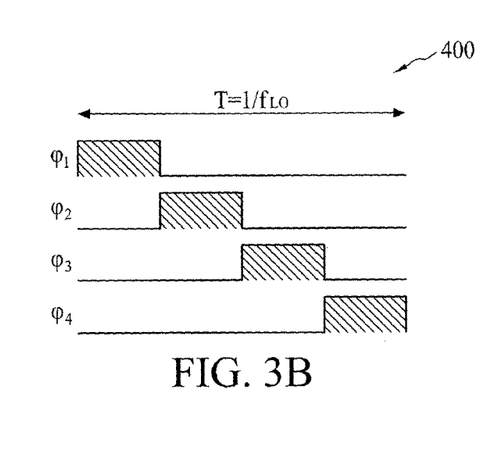
FIG. 3B illustrates a control signal timing diagram of the four-phase charge-sharing band-pass filter of FIG. 3A, in accordance with some embodiments.

In some embodiments, the four-phase CS BPF 16b includes a plurality of switches 160a-160d each coupled to one of the plurality of analog amplifiers 162a-162d. Each of the switches 160a-160d is controlled by a corresponding control signal $\Phi_1$-$\Phi_4$. Each of the control signals $\Phi_1$-$\Phi_4$ is equivalent to a 25% duty cycle of the LO signal such that each of the switches 160a-160d is closed for 25% of the duty cycle of the LO signal. Each of the control signals $\Phi_1$-$\Phi_4$ correspond to non-overlapping duty cycles. FIG. 3B is a graph 400 illustrating a plurality of control signals $\Phi_1$-$\Phi_4$ each corresponding to a 25% duty cycle of an LO signal having a frequency equal to $f_{LO}$. Each of the plurality of switches 160a-160d are further coupled to a capacitor 166. The capacitor 166 is charged by the sequential opening and closing of the plurality of switches 160a-160d. The sequential (or rolling) charging provides anti-aliasing filtering for a received analog signal.

Figure 4A:
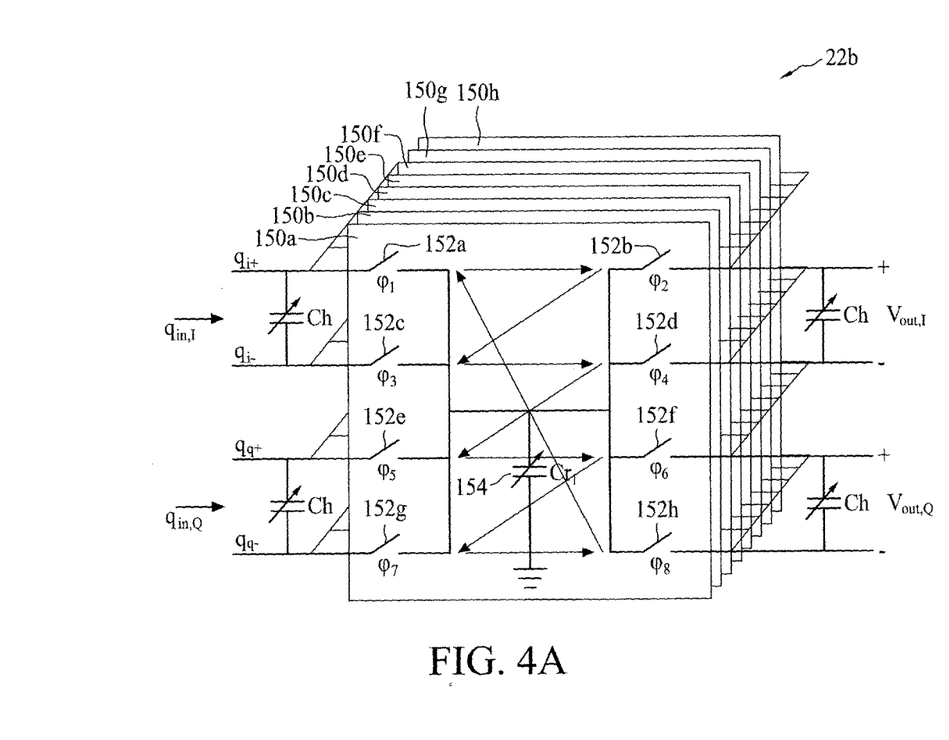
FIG. 4A illustrates an eight-phase charge-sharing band-pass filter, in accordance with some embodiments.
Figure 4B:
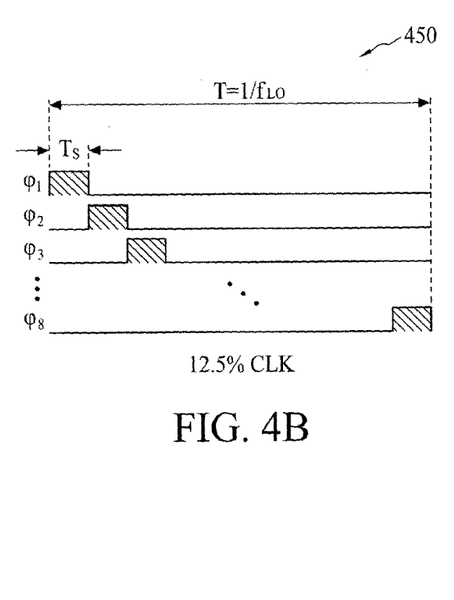
FIG. 4B illustrates a control signal timing diagram of the eight-phase charge-sharing band-pass filter of FIG. 4A, in accordance with some embodiments.

FIG. 4A illustrates an eight-phase CS BPF 22b, in accordance with some embodiments. The eight-phase CS BPF 22b is similar to the second phase IF filters 22a discussed above, and similar description is not repeated herein. The eight-phase CS BPF 22a includes a plurality of layers 150a-150h. Each of the plurality of layers 150a-150h includes a plurality of switches 152a-152h and a capacitor 154a-154h. In each of the layers 150a-150h, a first subset of the plurality of switches 152a-152h is coupled to a first input $q_{in,1}$, a second subset of the plurality of switches 152a-152h is coupled to a second input $q_{in,Q}$, a third subset of the plurality of switches 152a-152h is coupled to a first output $V_{out,I}$, and a fourth subset of the plurality of switches 152a-152h is coupled to a second output $V_{out,Q}$. Each of the switches 152a-152h is further coupled to a first side of the capacitor 154. Each of the switches 152a-152h is controlled by a control signal $\Phi_1$-$\Phi_8$ corresponding to a selected duty cycle of an LO signal. For example, in the illustrated embodiments, each of the switches 152a-152h is controlled by a control signal $\Phi_1$-$\Phi_8$ that is active (e.g., high) during a period corresponding to a 12.5% duty cycle portion of an LO signal having a frequency $f_{LO}$, although it will be appreciated that other corresponding duty cycles can be selected. FIG. 4B is a graph 450 illustrating a plurality of control signals $\Phi_1$-$\Phi_8$ each corresponding to a 12.5% duty cycle of an LO signal having a frequency equal to $f_{LO}$.

Each of the layers 150a-150h includes a different arrangement of switches 152a-152h in each of the first set, second set, third set, and fourth set of switches. For example, in the illustrated embodiment, the first layer 150a has a first set of switches including a first switch 152a and a third switch 152c, a second set of switches including a fifth switch 152e and a seventh switch 152g, a third set of switches including a second switch 152b and a fourth switch 152d, and a fourth set of switches including a sixth switch 152f and an eighth switch 152h. Each of the subsequent layers 150b-150h includes a different arrangement of switches in each of the first, second, third, and fourth set of switches.

Figure 5:
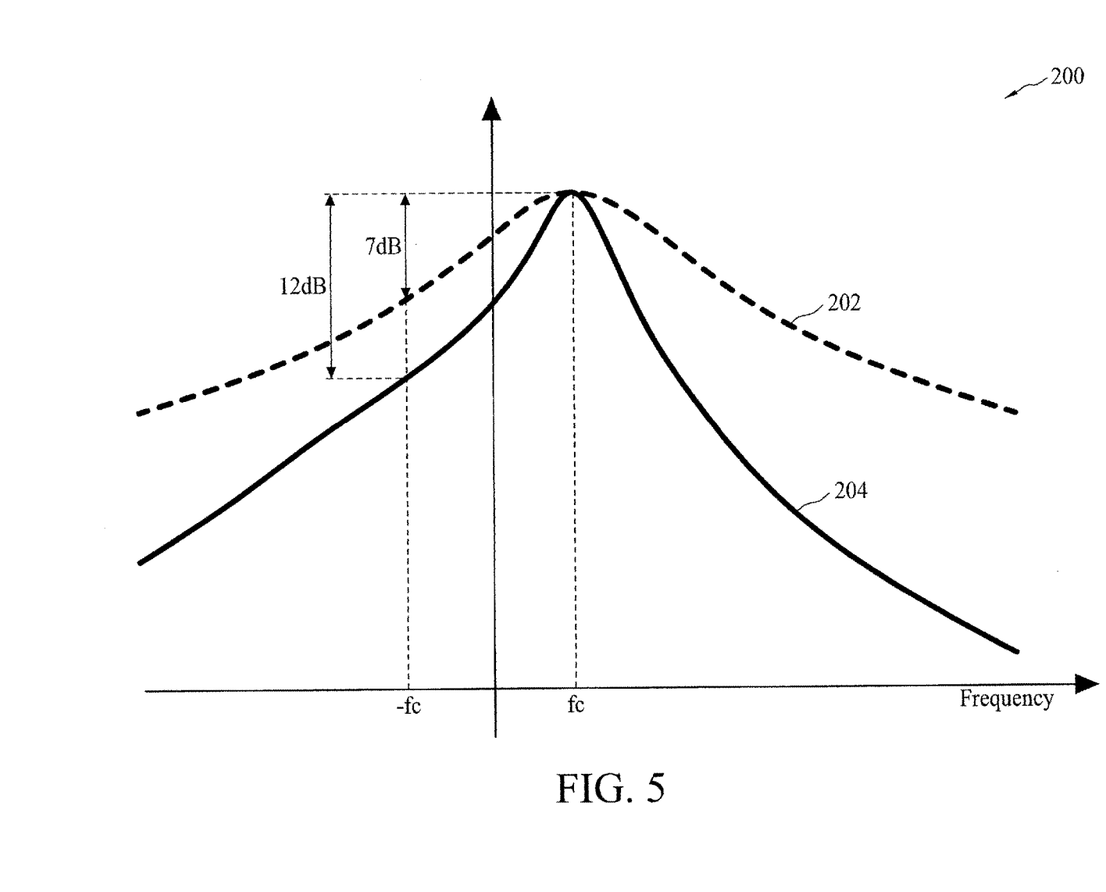
FIG. 5 illustrates a frequency response of the four-phase charge-sharing band-pass filter of FIG. 3A and the eight-phase charge-sharing band-pass filter of FIG. 4A, in accordance with some embodiments.

FIG. 5 is a graph 200 illustrating the frequency response 202, 204 of the four-phase BPF filter 16b and the eight-phase CS BPF filter 22b respectively, in accordance with some embodiments. As shown in FIG. 5, each of the four-phase CS BPF 16a and the eight-phase CS BPF 22b has an equal center frequency $f_c$. The four-phase CS BPF 16a frequency response 202 has a 7 dB drop at a negative center frequency and the eight-phase CS BPF 22b frequency response 204 has a 12 dB drop at the negative center frequency.

Figure 6:
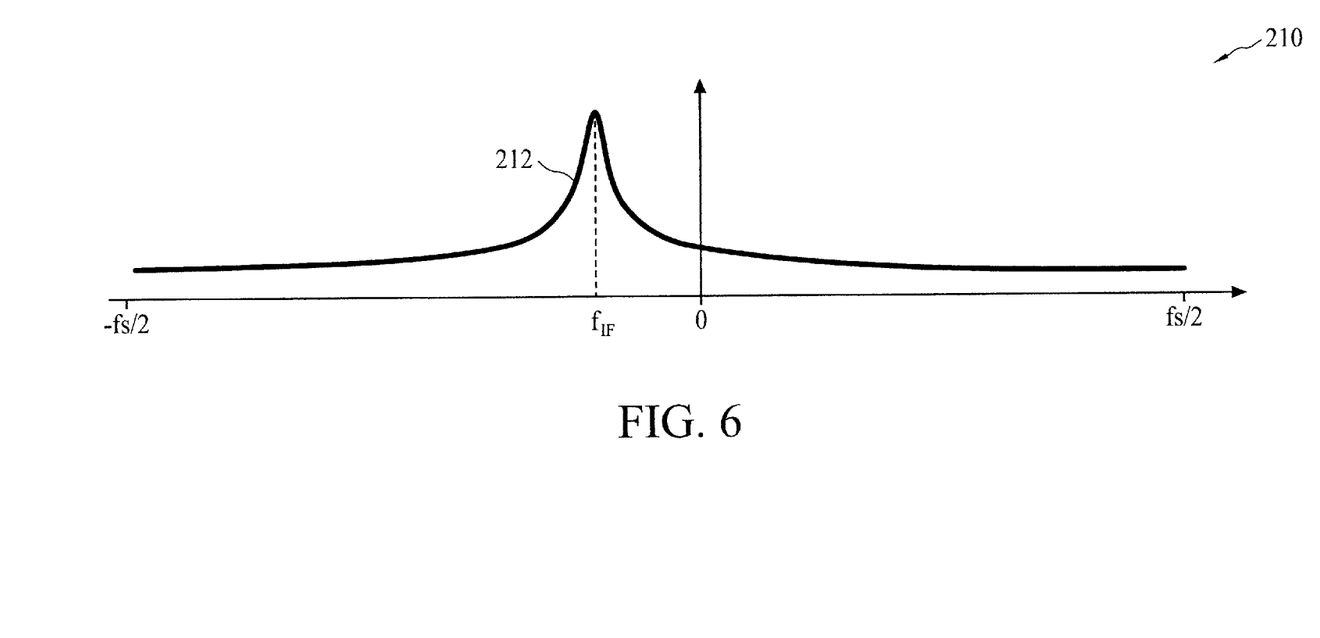
FIG. 6 illustrates a frequency response of an ultra-low-power receiver, in accordance with some embodiments.

FIG. 6 is a graph 210 illustrating a filtering response 212 of one embodiment of the ultra-low-power receiver 4 of FIG. 1, in accordance with some embodiments. As shown in FIG. 6, the progressively reduced CS BPFs 16, 22a of the ultra-low-power receiver 4 provides band-pass filtering with a sharp drop-off centered around the intermediate frequency (IF) of the signal without generating replica peaks, as commonly occurs in continuous time or N-path filters. The filtering response 212 provides sufficient anti-aliasing filtering for generating the discrete-time signal at the ADCs 30a, 30b.

Figure 7:
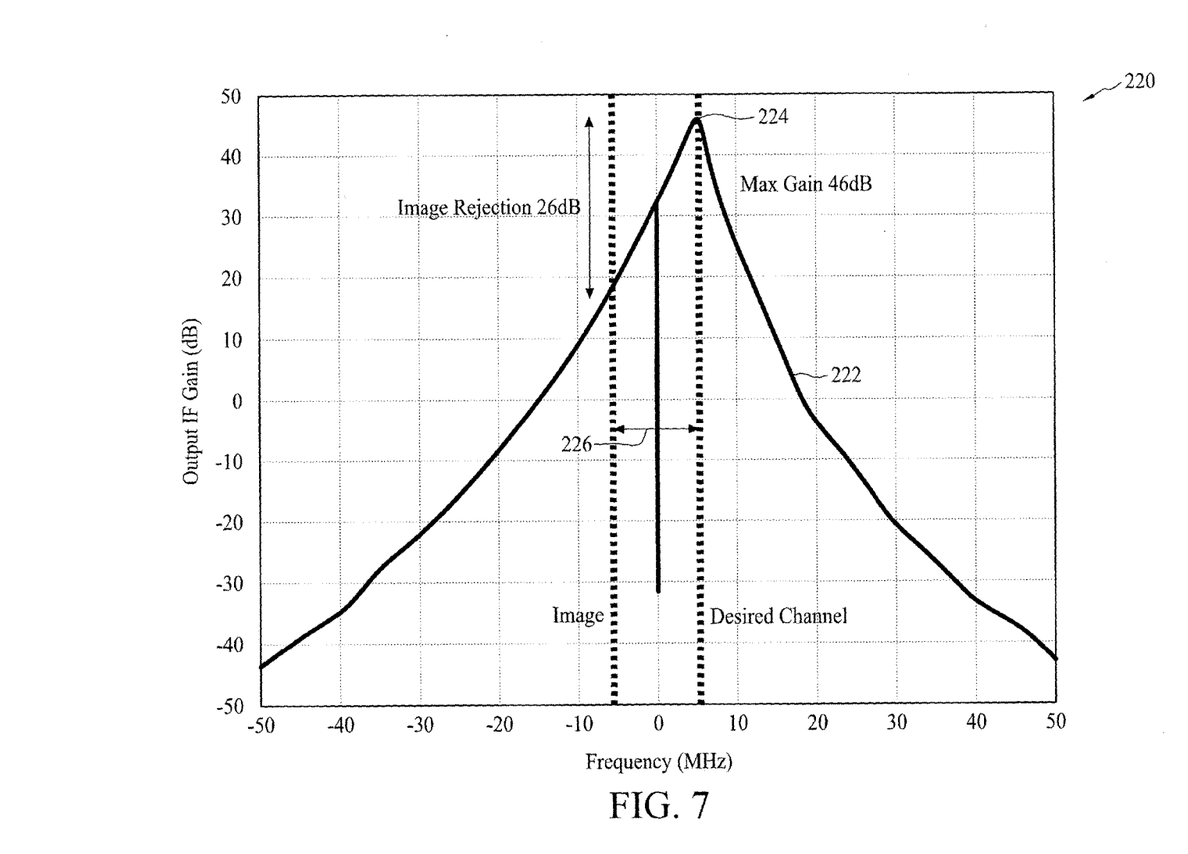
FIG. 7 illustrates an intermediate frequency (IF) transfer function of an ultra-low-power receiver, in accordance with some embodiments.
Figure 8:
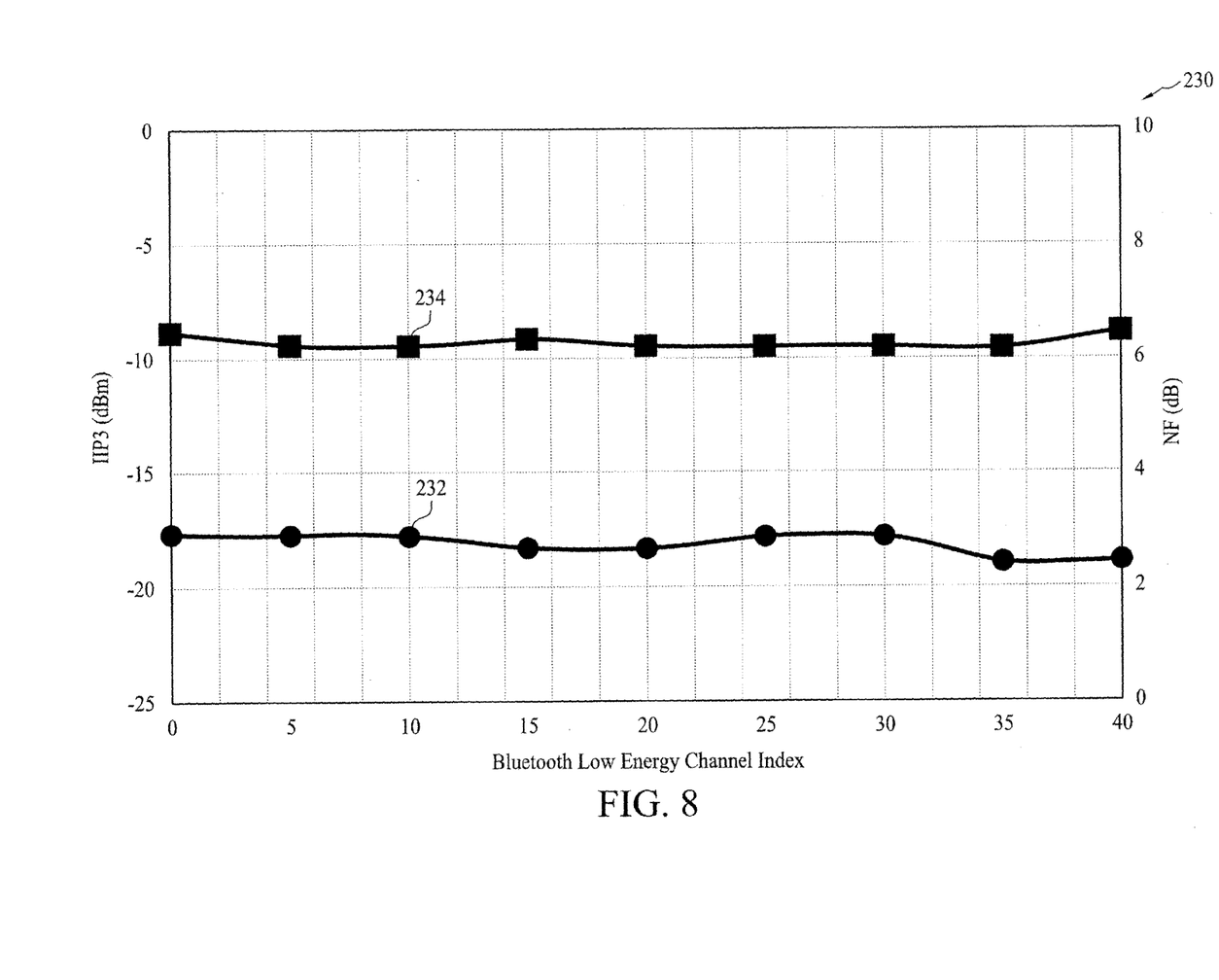
FIG. 8 is a graph illustrating an input power level (IIP3) and a noise figure (NF) of an ultra-low-power discrete-time receiver, in accordance with some embodiments.

FIG. 7 is a graph 220 illustrating a gain response 222 of one embodiment of the ultra-low-power receiver 4 of FIG. 1, in accordance with some embodiments. The gain response 222 includes a max gain of 46 dB at the desired intermediate frequency 224 and an image rejection of 26 dB outside of the target channel 226. Although the illustrated embodiment includes an intermediate frequency 224 of about 5 MHz, it will be appreciated that the ultra-low-power receiver 4 has a similar response at any suitable intermediate frequency. FIG. 8 is a graph 230 illustrating a third order input power level (IIP3) 232 and a noise figure (NF) 234 of an ultra-low-power receiver 4 configured to operate within the Bluetooth Low Energy channel index (shown on the x-axis). The IIP3 232 includes a minimum of about 19 dBm and the noise figure 234 includes an average value of about 6 dB. The minimum of about 19 dBm illustrates a high linearity of the CS BPFs 16, 22a of the ultra-low-power receiver 4. The noise figure 234 of about 6 dB illustrates the ratio of the output noise power of the ultra-low-power receiver 4 attributable to thermal noise. A value of about 6 dB indicates a low thermal noise of the ultra-low-power receiver 4 as compared to traditional receivers.

Figure 9:
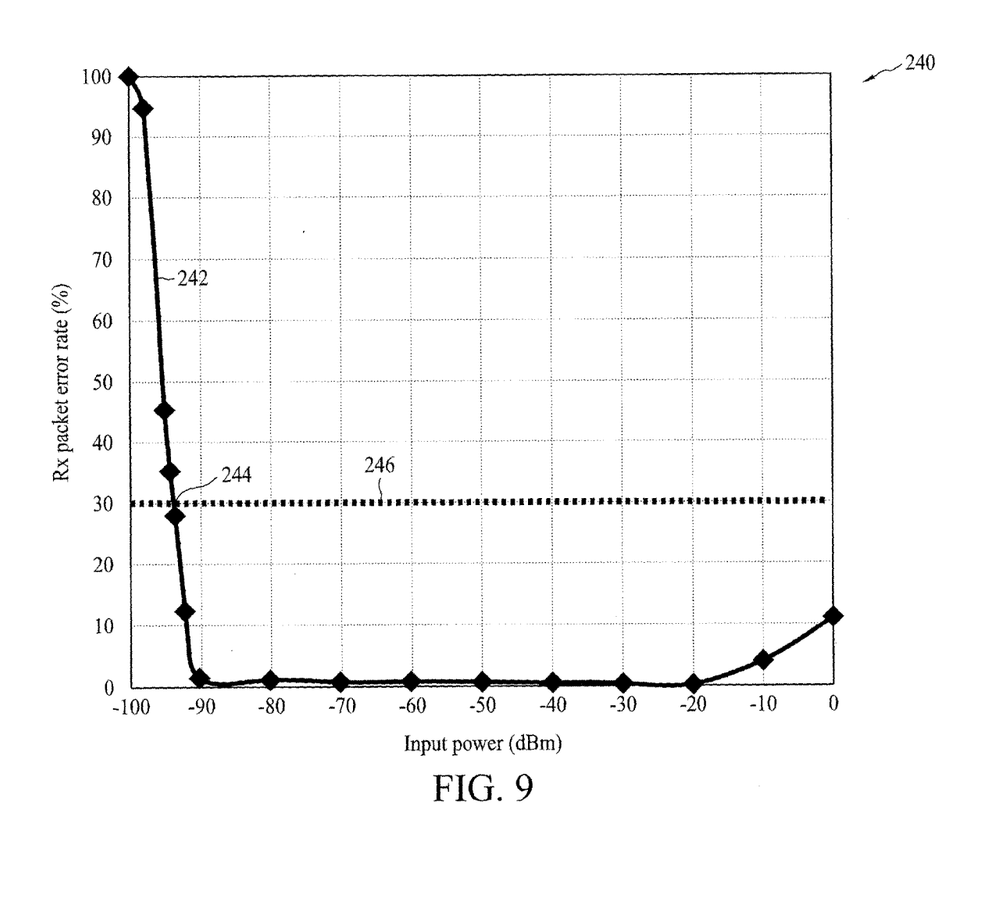
FIG. 9 is a graph illustrating receiver sensitivity of an ultra-low-power discrete-time receiver, in accordance with some embodiments.

FIG. 9 is a graph 240 illustrating receiver sensitivity 242 of an ultra-low-power discrete-time receiver, in accordance with some embodiments. The receiver sensitivity 242 illustrates the error packet rate of an ultra-low-power receiver, such as the ultra-low-power receiver 4 discussed above. As shown in FIG. 9, the ultra-low-power receiver 4 has a transmission packet error rate 244 of less than 30% at −95 dBm. A less than 30% error rate is sufficient for communication between IoT and other devices using ultra-low-power transceivers. For example, the BLE standard 246 requires a packet error rate of 30.8% at −95 dBm, which is satisfied by the disclosed ultra-low-power transceiver 2. It will be appreciated that other transmission packet error rates are possible and are within the scope of this disclosure.

Figure 10:
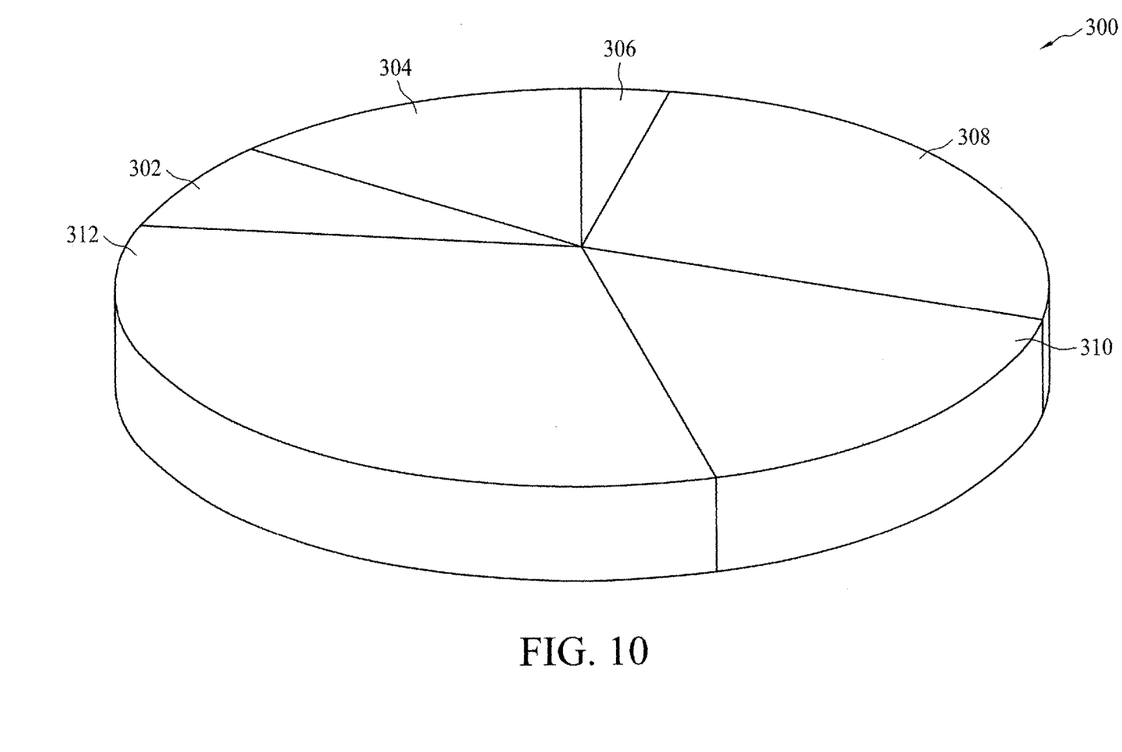
FIG. 10 is a chart illustrating power usage of an ultra-low-power discrete-time receiver, in accordance with some embodiments.

FIG. 10 is a pie chart 300 illustrating a percentage distribution of power usage for an ultra-low-power transceiver 2, in accordance with some embodiments. The first percentage 302 corresponds to power usage of divider 20 (equal to about 0.2 mW), the second percentage 304 corresponds to power usage of a DCO 48 (equal to about 0.4 mW), the third percentage 306 corresponds to power usage of an ADC 30a, 30b (equal to about 0.25 mW), the fourth percentage 308 corresponds to power usage of an LNA 12 (equal to about 0.7 mW), the fifth percentage 310 corresponds to power usage of a buffer 60 (equal to about 0.4 mW), and the sixth percentage 312 corresponds to generation of the discrete-time intermediate frequency signal, for example, by the plurality of progressively reduced CS BPFs 16, 22a (equal to about 0.8 mW). As illustrated in FIG. 10, the power consumption of the progressively reduced CS BPFs 16, 22a is lower than power consumption found in traditional receivers using traditional band-pass filters. Although specific embodiments having specific power percentages are discussed herein, it will be appreciated that any suitable power percentage can be allocated for the circuit components of an ultra-low-power transceiver 2 in accordance with various embodiments.

Figure 11:
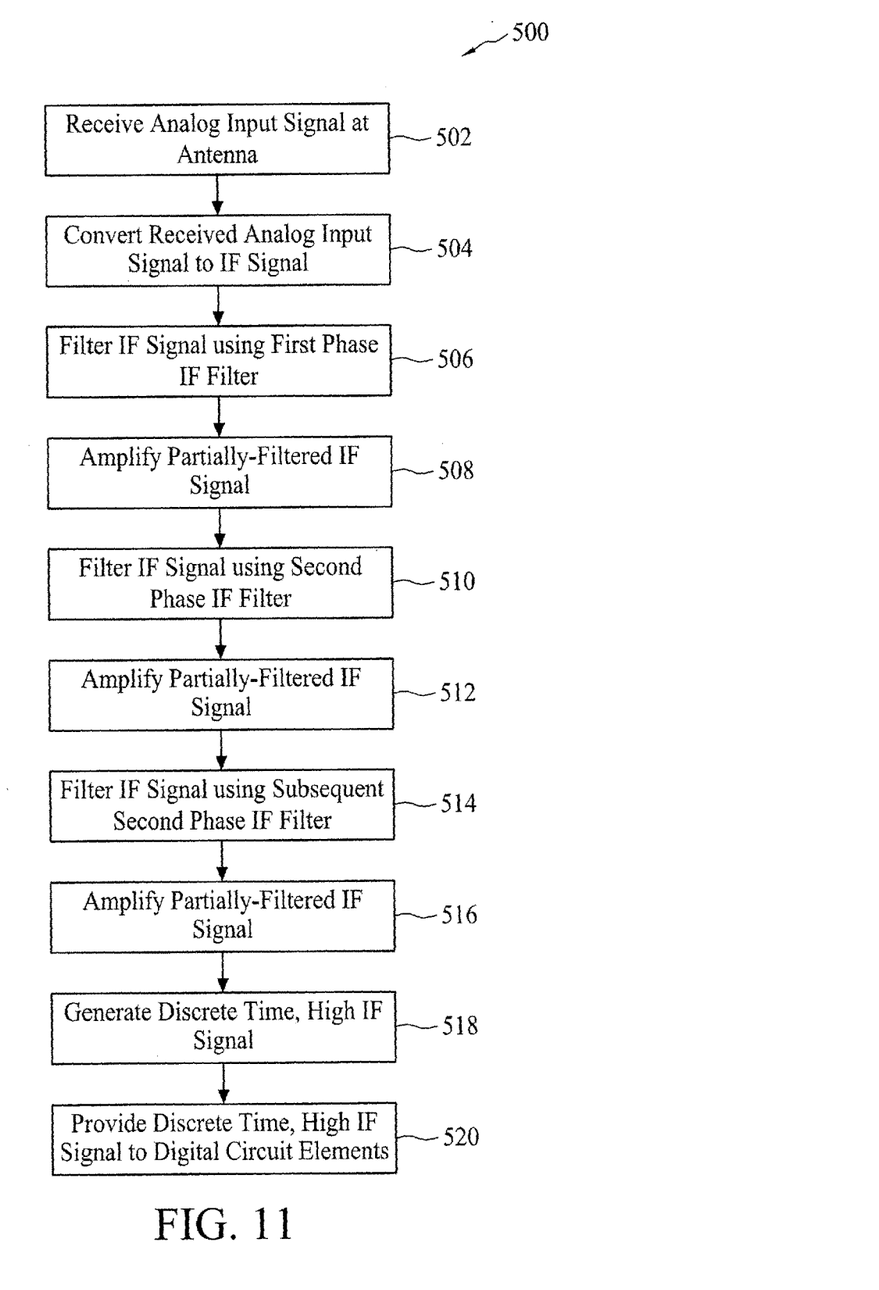
FIG. 11 is flow chart illustrating a method of generating a discrete time, high IF signal, in accordance with some embodiments.

FIG. 11 is a flow chart 500 illustrating operation of an ultra-low-power receiver, in accordance with some embodiments. At step 502, a signal is received by an antenna 10. The signal is a predetermined signal having a predetermined intermediate frequency and a predetermined modulation. At step 504, the signal is provided from the antenna 10 to one or more mixers 14a, 14b. The mixers 14a, 14b are configured to convert the received signal to an intermediate frequency (IF) signal.

At step 506, the IF signal is filtered by a first phase IF filter 16. The first phase IF filter 16 is configured to filter the mixed signal at a first predetermined sampling rate. For example, in some embodiments, the first phase IF filter 16 is configured to sample the mixed signal at a sampling rate of $4f_{LO}$, where $f_{LO}$ is the local oscillator frequency of the ultra-low-power transceiver 2. It will be appreciated that other sampling rates can be used and are within the scope of this disclosure. The first phase IF filter 16a generates a partially-filtered IF signal. At step 508, the partially-filtered IF signal is amplified by one or more analog amplifiers 18a, 18b.

At step 510, the partially-filtered IF signal is further filtered by a second phase IF filter 22a-1. The second phase IF filter 22a-1 is configured to filter the partially-filtered IF signal at a second predetermined sampling rate. For example, in some embodiments, the second phase IF filter 22a-1 is configured to sample the partially-filtered IF signal at a sampling rate of $f_{LO}/4$. It will be appreciated that other sampling rates can be used and are within the scope of this disclosure. In some embodiments, the second sampling rate is less than the first sampling rate.

At optional step 512, the partially-sampled IF signal generated by the second phase IF filter 22*a*-1 is amplified by one or more analog amplifiers 24*a*, 24*b*. At step 514, the amplified signal (or non-amplified partially-filtered IF signal of the second phase IF filter 22*a*-1) is provided to a subsequent second phase IF filter 22*a*-2 for further filtering and sampling. The subsequent second phase IF filter 22*a*-2 is configured to sample the partially-processed IF signal at the same sampling rate as the initial second phase IF filter 22*a*-1. The progressively reduced IF filters 16, 22*a* generate an analog signal having a strong IF with sufficient anti-aliasing filtering for generation of a discrete time, high IF signal.

At optional step 516, the output of the subsequent second phase IF filter 22*a*-2 is amplified by one or more analog amplifiers 28*a*, 28*b*. The output of the subsequent second phase IF filter 22*a*-2 is provided to one or more analog-to-digital converters 30*a*, 30*b*. At step 518, the analog-to-digital converters 30*a*, 30*b* generate the discrete time, high IF signal by digitizing the input analog signal having a strong IF. At step 520, the discrete time, high IF signal is provided to one or more digital circuit elements for signal processing.

In various embodiments, an ultra-low-power receiver is disclosed. The receiver includes a low-noise amplifier configured to receive an input analog signal and generate an amplified signal and a mixer electrically coupled to the low-noise amplifier. The mixer is configured to convert said amplified signal into an intermediate frequency signal. A progressively reduced intermediate frequency filter is configured to process the intermediate frequency signal from the mixer in discrete time.

In various embodiments, an ultra-low-power transceiver is disclosed. The ultra-low-power transceiver includes an antenna configured to receive an input analog signal, a receiver, and a transmitter. The receiver includes a low-noise amplifier configured to receive the input analog signal from the antenna and generate an amplified signal. A mixer is electrically coupled to the low-noise amplifier and is configured to convert said amplified signal into an intermediate frequency signal. A first-phase intermediate frequency filter having a first sampling rate and a second-phase intermediate frequency filter having a second sampling rate are progressively coupled to the mixer. The second sampling rate is lower than the first sampling rate.

In various embodiments, a method of generating a discrete time, high IF signal is disclosed. The method includes receiving an analog signal, converting the analog signal to an intermediate frequency signal, and filtering the intermediate frequency signal in discrete time. The intermediate frequency signal is filtered by a progressively-reduced intermediate frequency filter. A discrete time, high intermediate frequency signal is generated based on the filtered signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A receiver, comprising:
   a low-noise amplifier configured to receive an input analog signal and generate an amplified signal, wherein the low-noise amplifier is single ended;
   a mixer electrically coupled to the low-noise amplifier, the mixer configured to convert said amplified signal into an intermediate frequency signal;
   a progressively reduced intermediate frequency filter configured to process the intermediate frequency signal from the mixer in discrete time, wherein the progressively reduced intermediate frequency filter comprises a first phase band-pass filter and a second phase band-pass filter, wherein the first-phase band pass filter is a four-phase band pass filter.

2. The receiver of claim 1, wherein the second phase band-pass filter is an eight-phase band pass filter.

3. The receiver of claim 1, wherein the first phase band-pass filter has a first sampling rate and the second phase band-pass filter has a second sampling rate, and wherein the first sampling rate is higher than the second sampling rate.

4. The receiver of claim 3, wherein the first sampling rate is equal to $4f_{LO}$, where $f_{LO}$ is a local oscillator frequency used by the mixer and the second sampling rate is equal to $f_{LO}/4$.

5. The receiver of claim 1, wherein the first phase band-pass filter comprises a first set of switches coupled to a first capacitor, a second set of switches coupled to a second capacitor, a third set of the switches coupled to a third capacitor, and a fourth set of switches coupled to a fourth capacitor.

6. The receiver of claim 5, wherein each of the first set, the second set, the third set, and the fourth set of switches includes one of a first switch, a second switch, a third switch, and a fourth switch each operated at a duty cycle equal to 25% of a local oscillator frequency.

7. The receiver of claim 1, wherein the second phase band-pass filter comprises a first set of switches coupled to a first capacitor, a second set of switches coupled to a second capacitor, a third set of the switches coupled to a third capacitor, and a fourth set of switches coupled to a fourth capacitor, a fifth set of switches coupled to a fifth capacitor, a sixth set of switches coupled to a sixth capacitor, a seventh set of the switches coupled to a seventh capacitor, and an eighth set of switches coupled to an eighth capacitor.

8. The receiver of claim 7, wherein each of the sets of switches includes one of a first switch, a second switch, a third switch, a fourth switch, a fifth switch, a sixth switch, a seventh switch, and an eighth switch each operated at a duty cycle equal to 12.5% of a local oscillator frequency.

9. The receiver of claim 1, wherein the progressively reduced intermediate frequency filter comprises at least one charge-sharing intermediate frequency filter.

10. The receiver of claim 1, comprising an analog-to-digital converter electrically coupled to the progressively reduced intermediate frequency filter and configured to provide a discrete-time output signal.

11. The receiver of claim 1, wherein said amplified signal is a current signal.

12. A receiver, comprising:
    a low-noise amplifier configured to receive an input analog signal and generate an amplified signal, wherein the low-noise amplifier is single ended;

a mixer electrically coupled to the low-noise amplifier, the mixer configured to convert said amplified signal into an intermediate frequency signal;

a progressively reduced intermediate frequency filter configured to process the intermediate frequency signal from the mixer in discrete time, wherein the progressively reduced intermediate frequency filter comprises a first phase band-pass filter and a second phase band-pass filter, wherein the low-noise amplifier comprises an inductor-capacitor (LC) tank filter.

13. The receiver of claim 12, wherein the first phase band-pass filter has a first sampling rate and the second phase band-pass filter has a second sampling rate, and wherein the first sampling rate is higher than the second sampling rate.

14. The receiver of claim 13, wherein the first sampling rate is equal to $4f_{LO}$, where $f_{LO}$ is a local oscillator frequency used by the mixer and the second sampling rate is equal to $f_{LO}/4$.

15. The receiver of claim 12, wherein the first-phase band pass filter is a four-phase band pass filter.

16. The receiver of claim 15, wherein the second phase band-pass filter is an eight-phase band pass filter.

17. An ultra-low-power transceiver, comprising:
an antenna configured to receive an input analog signal;
a receiver, comprising:
  a low-noise amplifier configured to receive the input analog signal from the antenna and generate an amplified signal;
  a mixer electrically coupled to the low-noise amplifier, the mixer configured to convert said amplified signal into an intermediate frequency signal;
  a first-phase intermediate frequency filter having a first sampling rate; and
  a second-phase intermediate frequency filter having a second sampling rate, wherein the second sampling rate is lower than the first sampling rate; and
a transmitter coupled to the antenna.

18. The ultra-low-power transceiver of claim 17, wherein the first sampling rate is equal to $4f_{LO}$ and the second sampling rate is equal to $f_{LO}/4$, where $f_{LO}$ is a local oscillator frequency.

19. The ultra-low-power transceiver of claim 17, wherein at least one of the first-phase intermediate frequency filter or the second-phase intermediate frequency filter is a charge-sharing filter.

20. The ultra-low-power transceiver of claim 17, wherein at least one of the first-phase intermediate frequency filter or the at least one second-phase intermediate frequency filter is a band-pass filter.

* * * * *